United States Patent [19]
Yabuki et al.

[11] Patent Number: 5,138,284
[45] Date of Patent: Aug. 11, 1992

[54] PUSH-PUSH OSCILLATOR USING A TRANSMISSION LINE RESONATOR AND DIFFERENTIAL OUTPUT

[75] Inventors: Hiroyuki Yabuki, Kawasaki; Haruyoshi Endo, Zama; Morikazu Sagawa, Tokyo; Mitsuo Makimoto, Yokohama, all of Japan

[73] Assignee: Matsushita Electric Industrial Co., Ltd., Osaka, Japan

[21] Appl. No.: 722,468

[22] Filed: Jun. 27, 1991

[30] Foreign Application Priority Data

Jun. 29, 1990 [JP] Japan .................................. 2-173446
Nov. 28, 1990 [JP] Japan .................................. 2-332379

[51] Int. Cl.⁵ ............................................. H03B 5/18
[52] U.S. Cl. ...................................... 331/56; 331/100; 331/117 D
[58] Field of Search ............ 331/96, 99, 100, 107 DP, 331/107 P, 107 SL, 117 D, 56

[56] References Cited

U.S. PATENT DOCUMENTS

| | | | |
|---|---|---|---|
| 4,249,149 | 2/1981 | Diamand et al. | 333/223 |
| 4,527,130 | 7/1985 | Lütteke | 331/36 C |
| 4,749,963 | 6/1988 | Makimoto et al. | 331/99 |
| 4,763,084 | 8/1988 | Pavio, Jr. et al. | 331/56 |
| 4,783,638 | 11/1988 | Mamodaly et al. | 331/99 |

FOREIGN PATENT DOCUMENTS

0074687 3/1983 European Pat. Off. .

OTHER PUBLICATIONS

Wong, "Microstrip Tapped-Line Filter Design" IEEE Transactions on Microwave Theory and Techniques, vol. MTT-27, No. 1, Jan. 1979, pp. 44-50.
Nativ et al, "Push-Push VCO Design with CAD Tools", Microwave Journal, Feb. 1989, pp. 127-132.

*Primary Examiner*—Siegfried H. Grimm
*Attorney, Agent, or Firm*—Lowe, Price, LeBlanc & Becker

[57] ABSTRACT

A push-push oscillator comprises: a resonator having a transmission line and a capacitance connected to the transmission line in parallel; an oscillator for producing two outputs having an antiphase relation therebetween in response to the resonator; and a differential signal producing circuit for producing a differential signal in accordance with difference between these two outputs. These outputs can be obtained from the resonator. The transmission lines comprise strip line or microstrip line which is curved to form an open loop. The transmission line may be made of a dielectric material and is curved to form an open loop whose both ends are connected to a capacitance. The resonator may further comprise two second transmission lines, each provided to an end of the transmission line, these two second transmission lines facing each other with a given distance therebetween, the distance and length of the second transmission lines being determined such that necessary capacitance is provided. Impedance of each portion of the resonator is determined to miniaturize the resonator. The differential signal producing circuit comprises a balanced to unbalanced converting circuit.

16 Claims, 5 Drawing Sheets

$Zs^2 = Zpe \cdot Zpo$ $Zs^2 > Zpe \cdot Zpo$

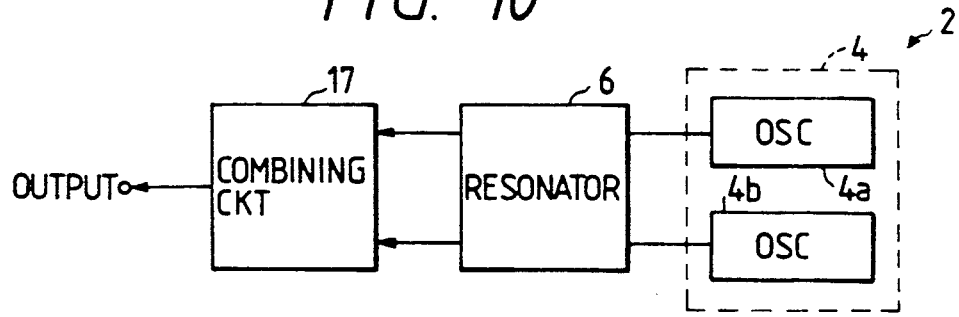
FIG. 10
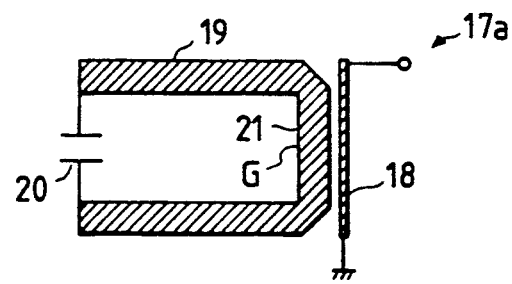
FIG. 11
FIG. 12
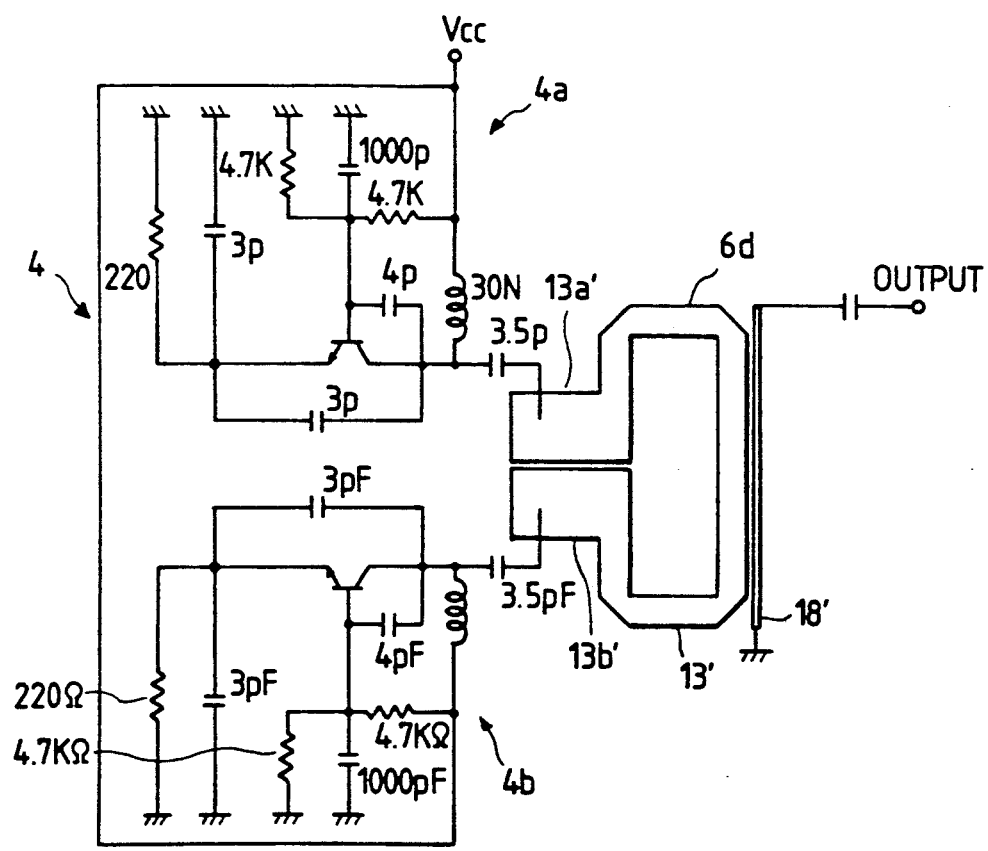

PUSH-PUSH OSCILLATOR USING A TRANSMISSION LINE RESONATOR AND DIFFERENTIAL OUTPUT

BACKGROUND OF THE INVENTION

1. Field of the Invention

This invention relates to a push-push oscillator, and particularly to a push-push oscillator for high-frequency radio, communication, and measuring apparatus.

2. Description of the Prior Art

A prior art TEM mode resonator is frequently used for a high-frequency miniaturized resonator comprising an open-end half-wave resonator and U-shaped resonator. This is described in many publications. FIG. 13 shows an example of open end half-wave resonator comprising a resonating transmission line 101. FIG. 14 shows a resonator 102 formed into U-shape by bending the resonating transmission line.

A prior art push-push oscillator using the above-mentioned resonator as a high-frequency oscillator is frequently used, which is described in "Push-Push VCO Design with CAD Tools" (Zvi Nativ and Yair Shur, Microwave Journal February 1989).

FIG. 15 shows a schematic circuit diagram of such prior art push-push oscillator. The push-push oscillator comprises a resonating portion 103, an oscillating portion 104 including two symmetric oscillators such as Colpitts oscillators, whose two outputs have a phase difference of 180° with each other, and a combining circuit 105 including transmission lines having the same electrical length for cancelling fundamental components and odd-order harmonic components and doubling only even-order harmonic components.

However, there is a problem that the size of the resonator 103 cannot be reduced because an area used for the resonator 103 is large to obtain a desired resonance frequency. This is because in the prior art resonator 103, the length of the resonator 103 is a half-wave which is large. Moreover, there is also a problem that a noise characteristic is poor because the combining circuit 105 of the push-push oscillating circuit combines the in-phase components with each other, so that externally incoming noise (in-phase) is doubled.

SUMMARY OF THE INVENTION

The present invention has been developed in order to remove the above-described drawbacks inherent to the conventional push-push oscillator.

According to the present invention there is provided a push-push oscillator comprising: a resonator having a transmission line and a capacitance connected to the transmission line in parallel; an oscillator for producing two outputs having an antiphase relation therebetween in response to the resonator; and a differential signal producing circuit for producing a differential signal in accordance with difference between these two outputs. The transmission line comprises strip line or microstrip line which is so curved to form an open loop. The transmission line may be made of a dielectric material and is so curved to form an open loop whose both ends are connected to a capacitance. The resonator may further comprise two second transmission lines, each provided to each end of the transmission line, these two second transmission lines facing each other with a given distance therebetween, the distance and length of the second transmission lines being determined such that necessary capacitance is provided. Impedance of each portion of the resonator is changed stepwise to miniaturize the resonator. The differential signal producing circuit comprises a balanced to unbalanced converting circuit.

According to the present invention there is also provided a push-push oscillator comprising: a resonator having transmission line and a capacitance connected to the transmission line in parallel; an oscillator for developing an oscillation condition together with the resonator; a circuit for obtaining two signals having an antiphase relation therebetween from the resonator in response to the oscillation; and a differential signal producing circuit for producing a differential signal in accordance with difference between these two signals.

BRIEF DESCRIPTION OF THE DRAWINGS

The object and features of the present invention will become more readily apparent from the following detailed description taken in conjunction with the accompanying drawings in which:

FIG. 10 is a schematic circuit diagram of the push-push oscillator 2 of the second embodiment;

FIG. 11 shows a schematic circuit diagram of an antiphase combining circuit of the second embodiment;

FIG. 12 is a schematic circuit diagram of a preferred embodiment of the invention of a push-push oscillator of the invention;

The same or corresponding elements or parts are designated as like references throughout the drawings.

DETAILED DESCRIPTION OF THE INVENTION

Hereinbelow will be described a first embodiment of this invention of a push-push oscillator with reference to FIG. 1.

Figure 1:
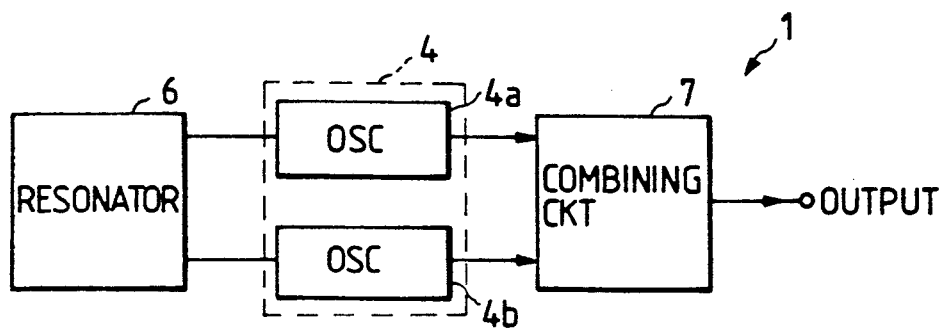
FIG. 1 is a schematic circuit diagram of a push-push oscillator of the first embodiment.

FIG. 1 is a schematic circuit diagram of a push-push oscillator of the first embodiment comprising: a resonator 6, an oscillating portion 4, and a combining circuit (antiphase combining circuit) 7. FIGS. 2-5 show various configurations of the resonator 6, FIGS. 6-9 show various configurations of the combining circuit 7.

The length of a resonator can be reduced by providing a gap in an annular transmission line (strip line or micro strip line) and a capacitor connected to both ends of the transmission line. The transmission line comprises a strip line. The term "strip line" includes a microstrip line and balanced strip line in addition to a strip line throughout the specification and the claims.

Figure 2:
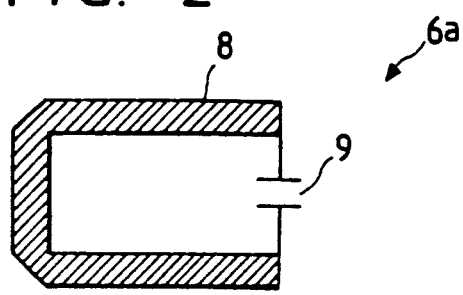
FIG. 2 shows a first resonator of the push-push oscillator of the first embodiment.

FIG. 2 shows such a resonator. In FIG. 2, a first resonator 6a comprises an annular transmission line 8 having a gap to which a lumped element capacitance, or capacitor 9 is connected. That is, the transmission line 8 forms a substantially complete loop having a gap whose both ends are connected to a capacitor 9.

Figure 3:
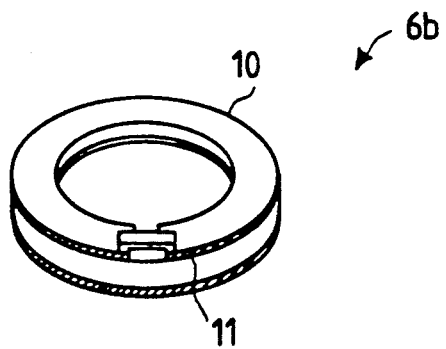
FIG. 3 shows a second resonator of the first embodiment.

FIG. 3 shows a second resonator 6b comprising an annular dielectric 10 having a gap to which a lumped element capacitance 11 is connected. In other words, an open loop whose both ends are connected to a capacitance 11.

Figure 4:
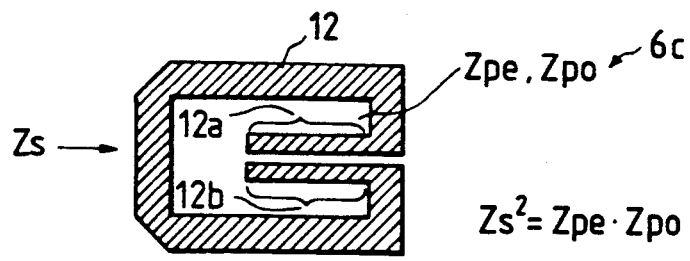
FIG. 4 shows a third resonator of the first embodiment.

FIG. 4 shows a third resonator 6c comprising an essentially annular transmission line 12 having coupled transmission lines 12a and 12b.

Assuming that an impedance of the annular transmission line 12 is $Zs_1$, an even mode impedance of the coupled transmission lines 12a and 12b is $Zpe_1$, and an odd mode impedance is $Zpo_1$, each dimensions of the third resonator 6c is determined in accordance with $Zs_1^2 = Zpe_1 \cdot Zpo_1$.

Figure 5:
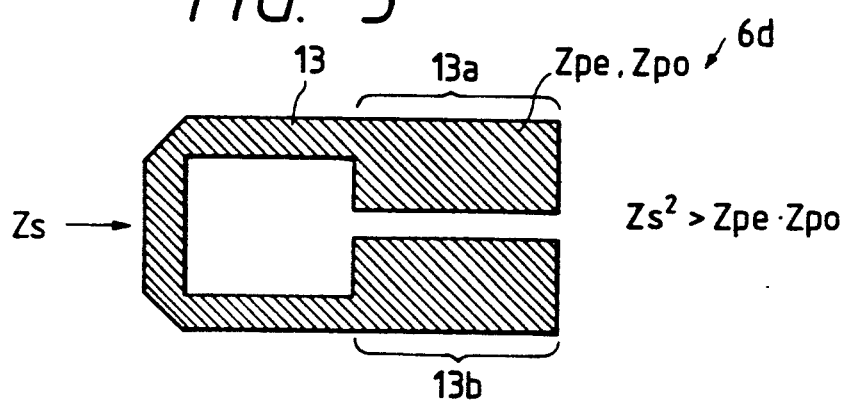
FIG. 5 shows a fourth resonator of the first embodiment.

FIG. 5 shows a fourth resonator 6d comprising coupled lines 13a and 13b and a U-shaped transmission line 13 whose impedance is changed stepwise from the coupled lines 13a and 13b. It is assumed that the impedance of the U-shaped transmission line 13 is $Zs_2$, an even mode impedance of the coupled transmission lines 13a and 13b is $Zpe_2$, and an odd mode impedance is $Zpo_2$. The length of the fourth resonator can be further decreased, compared with the third resonator shown in FIG. 4 by determining each dimension of the resonator 6d in accordance with $Zs_2^2 > Zpe_2 \cdot Zpo_2$.

According to the above-mentioned structure, a miniaturized resonator is formed whose output signals at both ends have a phase difference of 180° at resonance frequency.

The oscillating portion 4 has two well-known oscillators 4a and 4b, such as Colpitts oscillators, which have the same circuit structure and are arranged symmetrically. Therefore, outputs of those oscillators 4a and 4b have 180° phase difference therebetween.

Two outputs from the oscillating portion 4 have a phase difference of 180° therebetween, so that the fundamental wave component is doubled in amplitude by an antiphase combining circuit as a differential signal producing circuit, on the other hand, noise components externally incoming are suppressed because of in-phase relation.

Figure 6:
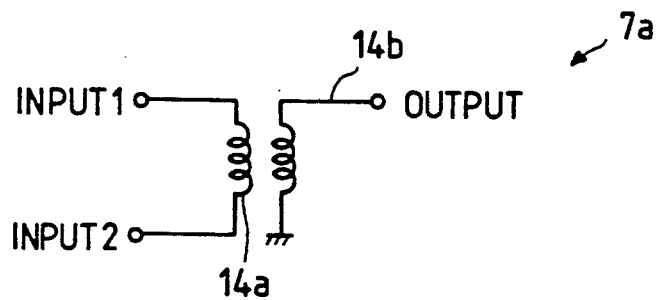
FIG. 6 shows a balanced-unbalanced converting circuit as an antiphase combining circuit of the push-push oscillator of the first embodiment.

FIG. 6 shows a balanced-unbalanced converting circuit 7a as a first antiphase combining circuit of the push-push oscillator 1 for combing two inputs such that two in-phase components cancel each other and two antiphase components are doubled in amplitude. The first antiphase combining circuit 7a comprises a first coil 14a, whose one end is supplied with a first input INPUT1 and whose another end is supplied with a second input INPUT2, and a second coil 14b whose one end is grounded and an output appears at another end.

Figure 7:
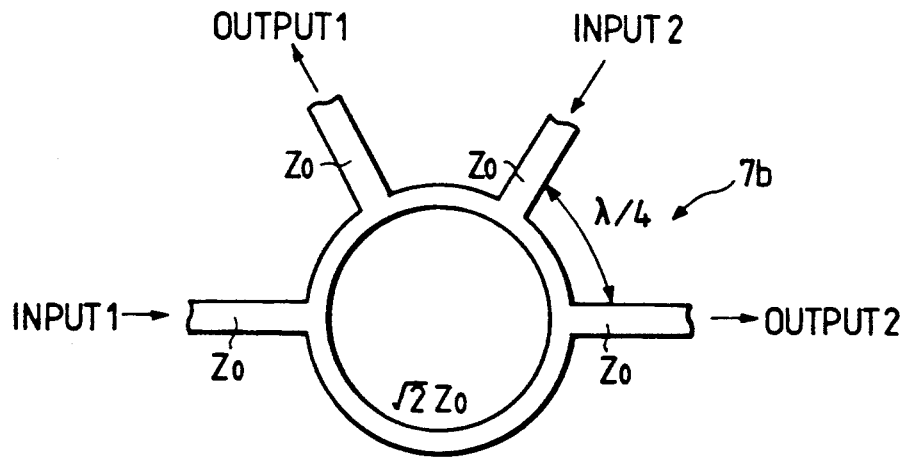
FIG. 7 shows a rat race circuit as a second antiphase combining circuit of the push-push oscillator of the first embodiment.

FIG. 7 shows a rat race circuit 7b as a second antiphase combining circuit 7b of the push-push oscillator 1. The antiphase combining circuit 7b produces a differential signal in accordance with difference between input signals INPUT1 and INPUT2.

Figure 8:
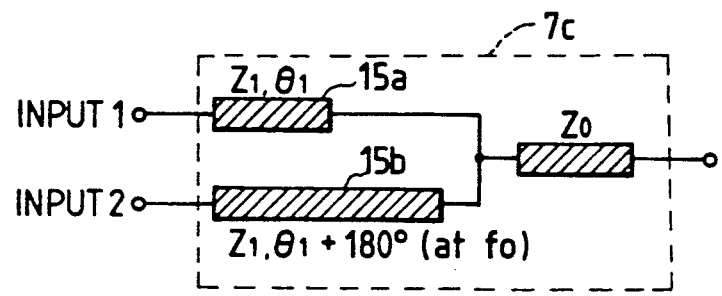
FIG. 8 shows a third antiphase combining circuit of the first embodiment.

FIG. 8 shows a third antiphase combining circuit 7c comprising transmission lines 15a and 15b having a phase difference of 180° in electrical length at its oscillating frequency for producing the differential signal between two input signals INPUT1 and INPUT2.

Figure 9:
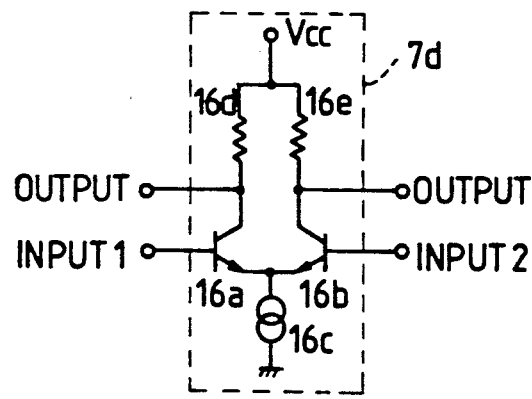
FIG. 9 shows a differential amplifier as a fourth antiphase combing circuit of the first embodiment.
Figure 13:
FIG. 13 shows a prior art open-end half-wave resonator.
Figure 14:
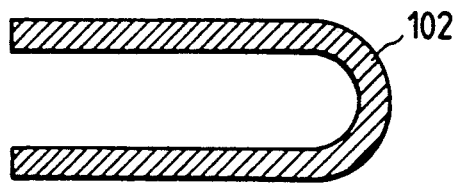
FIG. 14 shows a prior art resonator formed into U-shape.
Figure 15:
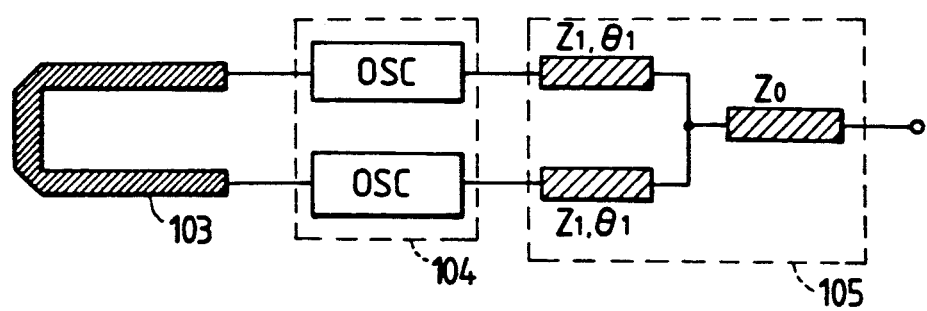
FIG. 15 shows a schematic circuit diagram of a prior art push-push oscillator.

FIG. 9 shows a differential amplifier as a fourth antiphase combining circuit 7d, comprising a pair of transistors 16a and 16b, a constant current source 16c, and resistors 16d and 16e. The pair of transistors 16a and 16b amplify the difference between two inputs INPUT1 and INPUT2 to produce two outputs in order to effect antiphase-combining.

Hereinbelow will be described a second embodiment of the push-push oscillator with reference to FIG. 10.

FIG. 10 is a schematic circuit diagram of the push-push oscillator 2 of the second embodiment, comprising a resonator 6, oscillating portion 4, and an antiphase combining circuit portion 17. The resonator 6 and the oscillating portion 4 are the same as those of the first embodiment respectively. Operation of the resonator 6 and the oscillating portion 4 are substantially the same as that of the first embodiment. On the other hand, outputs having the antiphase relation are obtained from a resonator 6, which is different from the first embodiment.

FIG. 11 shows a schematic circuit diagram of an antiphase combining circuit 17a. The antiphase combining circuit 17a comprises a substantially annular (U-shaped) transmission line 19 having a gap to which a lumped element capacitance 20 is connected. A second transmission line 18 is arranged in parallel to a portion 21 of the transmission line 19, including a virtual ground G and is so arranged that the virtual ground G divides the second transmission line 18 into two portions having electrical lengths which are equal to each other. Then, one end of the second transmission line 18 is grounded. An output is obtained from another end of the second transmission line 18.

FIG. 12 is a schematic circuit diagram of a preferred embodiment of the invention of a push-push oscillator. The oscillating portion 4 has two common-base configurations of Colpitts oscillators 4a and 4b, which have the same circuit arrangement and are arranged symmetrically to generate outputs having an antiphase relation.

Material of a printed circuit board is glass-epoxy whose dielectric constant is 4.7 and thickness is 0.8 mm, and dielectric dissipation factor is 0.02.

A resonator 6d' comprises an essentially annular transmission line 13' whose impedance is changed stepwise from the coupled lines 13a' and 13b' which is similar to the resonator shown in FIG. 5. It is assumed that the impedance of the annular transmission line 13' is $Zs_3$, an even mode impedance of the coupled transmission lines 13a' and 13b' is $Zpe_3$, and an odd mode impedance is $Zpo_3$. As the result, $Zs_3 = 62.6\Omega$, $Zpe_3 = 39.4\Omega$, and $Zpo_3 = 24.9\Omega$ are given. Electrical length $\theta s$ of the annular line portion 13' is $\theta s = 64°$; electrical length of coupled lines 13a' and 13b' is $\theta p = 30°$.

Estimations of the above-mentioned push-push oscillating circuit have been made.

At first, measurement is carried out under the condition that one of oscillators 4a and 4b is not connected to the resonator 6d', i.e., only one oscillator 4a is connected to the resonator 6d'. As the result, it is obtained that its oscillation frequency is 750 MHz, and a carrier to noise ratio C/N is 73 dB at 8 KHz band and 12.5 KHz offset. This result is equivalent to the synthesizer of a portable telephone in current use.

Then, estimations have been done for the push-push oscillator using both oscillators 4a and 4b, which is the same as the second embodiment. As the result, the carrier to noise ratio C/N is 82 dB which is lower than the above-mentioned estimation by 9 dB. The reason is considered as follows:

A decisive factor of the noise characteristic is externally incoming noise components. Therefore, such noise components are cancelled by antiphase combining. Another factor is narrow band characteristic which the push-push oscillating circuit shows originally because under a resonating condition, these oscillators 4a and 4b are in an injection locked condition.

As mentioned above, according to the invention, a push-push oscillating circuit comprising a resonator having an essentially annular transmission line with a gap whose ends are connected to a capacitor and an antiphase combining circuit for antiphase-combining two outputs from the resonator whose phase difference is 180°. This provides a small size oscillating circuit having low noise characteristics.

What is claimed is:

1. A push-push oscillator comprising:
   (a) a resonator having a transmission line and a capacitance connected to said transmission line in parallel;
   (b) oscillating means for producing two outputs having an antiphase relation therebetween in response to said resonator; and
   (c) differential signal producing means for producing a differential signal in accordance with the difference between said two outputs.

2. A push-push oscillator as claimed in claim 1, wherein said transmission line is curved to form an open loop.

3. A push-push oscillator as claimed in claim 1, wherein said transmission line comprises a strip line.

4. A push-push oscillator as claimed in claim 1, wherein said transmission line is made of a dielectric material and is curved to form an open loop.

5. A push-push oscillator as claimed in claim 2, wherein said capacitance comprises two second transmission lines, each provided to an end of said transmission line, said two second transmission lines facing each other with a given distance therebewteen, said distance and length of said second transmission lines being determined such that necessary capacitance is provided.

6. A push-push oscillator as claimed in claim 1, wherein said transmission line comprises a substantially U-shaped strip line and said capacitance comprises two second transmission lines formed to have larger width than said U-shaped strip line, each provided to an end of said U-shaped strip line, said two second transmission lines facing each other with a given distance therebetween, said distance and length of said second transmission lines being determined such that necessary capacitance is provided.

7. A push-push oscillator as claimed in claim 1, wherein said differential signal producing means comprises a balanced to unbalanced converting circuit.

8. A push-push oscillator as claimed in claim 1, wherein said differential signal producing means comprises a rat race circuit.

9. A push-push oscillator as claimed in claim 1, wherein said differential signal producing means comprises second and third transmission lines whose electrical lengths have a phase difference of 180° therebetween at a resonance frequency of said resonator.

10. A push-push oscillator as claimed in claim 1, wherein said differential signal producing means comprises a differential amplifier.

11. A push-push oscillator as claimed in claim 1, wherein said oscillating means comprises two equal oscillators arranged symmetrically.

12. A push-push oscillator comprising:
   (a) a resonator having a transmission line and a capacitance connected to said transmission line in parallel;
   (b) oscillating means for developing an oscillation condition together with said resonator;
   (c) means for coupling to said resonator to obtain two signals having an antiphase relation therebetween from said resonator in response to said oscillation; and
   (d) differential signal producing means for producing a differential signal in accordance with the difference between said two signals.

13. A push-push oscillator as claimed in claim 12, wherein said transmission line is curved to form an open loop.

14. A push-push oscillator as claimed in claim 13, wherein said transmission line comprises a strip line.

15. A push-push oscillator as claimed in claim 14, wherein said strip line has a straight line portion including a virtual ground point of said strip line and said means for coupling and differential signal producing means comprise a second strip line arranged in parallel to said straight line portion, said second strip line being arranged such that said virtual ground divides said second strip line into two portions having electrical lengths which are equal to each other.

16. A push-push oscillator as claimed in claim 12, wherein said oscillating means comprises two equal oscillators arranged symmetrically.

* * * * *